United States Patent
Gao (10) Patent No.: US 11,116,114 B2
(45) Date of Patent: Sep. 7, 2021

(54) COOLING SYSTEM DESIGN FOR DATA CENTERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/445,068

(22) Filed: Jun. 18, 2019

(65) Prior Publication Data

US 2020/0404813 A1   Dec. 24, 2020

(51) Int. Cl.
H05K 7/20 (2006.01)

(52) U.S. Cl.
CPC ..... *H05K 7/20818* (2013.01); *H05K 7/20745* (2013.01)

(58) Field of Classification Search
CPC ........... H05K 7/20836; H05K 7/20781; H05K 7/20736; H05K 7/20745; H05K 7/2079; H05K 7/20827; H05K 7/20772; H05K 7/1485; H05K 7/1487; H05K 7/1497; H05K 7/20145; H05K 7/20318; H05K 7/20709; H05K 7/20727; H05K 7/208; H05K 7/20818; H01L 23/473; F25B 2339/041; F25D 16/00; F28D 15/00; F28D 15/0266; G06F 1/20; G06F 1/206; G06F 2200/201
See application file for complete search history.

(56) References Cited

U.S. PATENT DOCUMENTS

| | | | | |
|---|---|---|---|---|
| 4,313,310 A  * | 2/1982 | Kobayashi | ................. | F24F 1/00 62/175 |
| 2004/0050231 A1* | 3/2004 | Chu | ..................... | H05K 7/2079 83/574 |
| 2004/0221604 A1* | 11/2004 | Ota | ..................... | H05K 7/20781 62/259.2 |
| 2010/0242532 A1* | 9/2010 | Kopko | ................... | F25B 25/005 62/498 |
| 2011/0029152 A1* | 2/2011 | Patel | ................... | H05K 7/20836 700/300 |
| 2012/0218711 A1* | 8/2012 | Kashirajima | ........... | F25B 25/00 361/700 |
| 2013/0021746 A1* | 1/2013 | Campbell | .......... | H05K 7/20145 361/679.47 |
| 2013/0025818 A1* | 1/2013 | Lyon | .................. | H05K 7/20781 165/11.1 |

(Continued)

*Primary Examiner* — Stephen S Sul
*Assistant Examiner* — Michael A Matey
(74) *Attorney, Agent, or Firm* — Womble Bond Dickinson (US) LLP (57) ABSTRACT

In one embodiment, a data center cooling system includes one or more information technology (IT) rooms having multiple electronic racks that generate heat. An external cooling unit is positioned above the IT rooms and is configured to provide cooling fluid and to exchange heat carried by the cooling fluid. The external cooling unit has a supply line to distribute cooling fluid downwardly to the IT rooms. As the cooling fluid cools the electronic racks, the cooling fluid heats up and at least partially turns to vapor which rises due to convection. The external cooling unit also has a return line to return the rising vapor to the external cooling unit, which cools the vapor. The vapor changes phase to liquid and is recirculated to the IT rooms.

18 Claims, 8 Drawing Sheets

(56) References Cited

U.S. PATENT DOCUMENTS

| | | | | |
|---|---|---|---|---|
| 2014/0321050 | A1* | 10/2014 | Sato | G06F 1/20 |
| | | | | 361/679.47 |
| 2015/0048950 | A1* | 2/2015 | Zeighami | H05K 7/20781 |
| | | | | 340/605 |
| 2015/0345846 | A1* | 12/2015 | Kopko | F25B 40/04 |
| | | | | 62/115 |
| 2016/0174417 | A1* | 6/2016 | Hachiya | H05K 7/20836 |
| | | | | 62/115 |
| 2017/0013746 | A1* | 1/2017 | Campbell | H05K 7/20781 |
| 2017/0280593 | A1* | 9/2017 | Magallanes | H05K 7/20736 |

\* cited by examiner

COOLING SYSTEM DESIGN FOR DATA CENTERS

FIELD OF THE INVENTION

Embodiments of the present invention relate generally to data centers. More particularly, embodiments of the invention relate to cooling electronic racks in data centers.

BACKGROUND

Heat removal is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases as the temperature of their environment increases. Maintaining a proper thermal environment is critical for normal operations of these servers in data centers, as well as the server performance and lifetime. Heat removal solutions are necessary to cool these high performance servers and IT equipment.

Power intensive processors enable the solution of intensive computing such as deep learning. Electrical servers having those processors, i.e., high-power central processing units (CPUs) and/or general-purpose or graphical processing units (GPUs), have a very high power density per volumetric space. Liquid cooling is one feasible thermal management solution for high power density.

In liquid cooling, a manifold is used for distributing and regulating fluid with main inlet/outlet ports and fluid sub-ports. The main inlet and outlet ports are connected to external cooling source, and the sub ports are connected with either server loops or cooling device loops. Conventional manifold designs are not efficient in some application scenarios. There is little room for large data centers close to the city. The land that is available is expensive. Data center with multi-floors for IT room is a new design standardization. Traditional data centers generally occupy sprawling, single-level warehouses. To place such a data center in the middle of a large city would be prohibitively expensive. Also, cooling systems designed for single-level data centers use a large amount of power to push the cold air or cold liquid to the IT rooms.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a vertically-oriented data center with a cooling unit located above the data center is provided. In one embodiment, the cooling system includes an external cooling unit and one or more cooling loops that carry cooling fluid to the heat-generating IT components. The external cooling unit is located above the IT room that houses the IT components. The cooling fluid is delivered to cold plates adjacent to the IT components using gravity as the only or primary moving force. When the cooling fluid reaches the IT components, it absorbs much of the heat generated by the IT components. The absorbed heat causes the cooling fluid to heat up and turn to vapor. The vapor then rises naturally through convection up through a return line and back to the external cooling unit. The vapor is then cooled and returns back to liquid form, where it is used again as cooling fluid to cool the IT components. This way, the amount of space required by the data center is reduced because the IT rooms are stacked on top of one another. Also, the power required to cool the data center is reduced because the primary moving force of the cooling fluid is gravity and convection rather than a motor or any mechanical cooling device.

According to an aspect of the invention, a data center cooling system includes a first information technology (IT) room having a first set of a plurality of electronic racks, each of the electronic racks in the first set containing an array of IT components therein, where at least a portion of the IT components are cooled by a server liquid cooling system via, for example a cold plate, a rear door heat exchanger, a room liquid cooling unit such as CRAH/CRAC, or any other suitable mechanism. The data center cooling system further includes an external cooling unit positioned above the first IT room configured to provide cooling fluid and to exchange heat carried by the cooling fluid, a supply line, and a return line. The supply line is to receive the cooling fluid from the external cooling unit and to distribute the cooling fluid downwardly to each of the cold plates in the first IT room to exchange heat generated by associated IT components attached thereon, where the cooling fluid evaporates into a vapor state from a liquid state during the heat exchange. The return line to return the cooling fluid in the vapor state upwardly back to the external cooling unit, which transforms back to the liquid state due to heat exchange within the external cooling unit.

According to one embodiment, the data center cooling system further includes a second IT room positioned underneath the first IT room, the second IT room having a second set of a plurality of electronic racks, each of the electronic racks in the second set containing a plurality of IT components therein. At least a portion of the IT components in the second set are attached to a server liquid cooling system via any suitable cooling unit, such as a cold plate, a rear door heat exchanger, a room liquid cooling unit such as CRAH/CRAC (computer room air handler/computer room air conditioning), or any other suitable mechanism. The supply line is further to distribute the cooling fluid downwardly to each of the cold plates in the second IT room to exchange heat generated by associated IT components attached thereon. The cooling fluid evaporate into a vapor state from a liquid state during the heat exchange to be returned back to the external cooling unit via the return line.

In one embodiment, the external cooling unit comprises a first fluid tank coupled to the external cooling unit to receive cooling fluid and to store sufficient amount of cooling fluid to provide sufficient liquid pressure to distribute the cooling fluid downwardly to the IT room. A second fluid tank is coupled to the first fluid tank, where the second fluid tank provides additional cooling fluid to the first fluid tank when the cooling fluid in the first fluid tank falls below a predetermined threshold. The first fluid tank comprises a fluid level sensor to sense a fluid level within the first fluid tank, which causes a valve between the first fluid tank and the second fluid tank opened, in response to detecting that the cooling fluid in the first fluid tank falls below the predetermined threshold or exceeds the upper limitation.

According to one embodiment, a room cooling unit is disposed within the first IT room, where the room cooling unit includes a liquid-to-air heat exchanger coupled to the supply line to receive cooling fluid, to exchange heat from circulated air of the first IT room, and to return back to the external cooling unit in the vapor state via the return line. The circulated air is to travel through an air space of at least a portion of the electronic racks to exchange at least a portion of the heat generated from the associated IT components.

According to another aspect of the invention, a data center cooling system includes a first information technology (IT) room having a first set of a plurality of electronic racks, each of the electronic racks in the first set containing a plurality of IT components therein, where at least a portion of the IT components are cooled by a server liquid cooling system via, for example a cold plate, a rear door heat exchanger, a room liquid cooling unit such as CRAH/CRAC, or any other suitable mechanism. The data center cooling system further includes a second IT room positioned underneath the first IT room, the second IT room having a second set of a plurality of electronic racks, each of the electronic racks in the second set containing a plurality of IT components therein, where at least a portion of the IT components in the second set are attached to cold plates. The data center cooling system further includes an external cooling unit positioned above the first IT room configured to provide cooling fluid and to exchange heat carried by the cooling fluid.

The data center cooling system further includes a first supply line to receive at least a portion of the cooling fluid from the external cooling unit and to distribute the cooling fluid downwardly to the cooing unit or cooling device in the first IT room to exchange heat generated by associated IT components attached thereon, where the cooling fluid evaporates into a vapor state from a liquid state during the heat exchange. The data center cooling system further includes a first return line to return the cooling fluid of the first IT room in the vapor state upwardly back to the external cooling unit, which transforms back to the liquid state due to heat exchange within the external cooling unit. The data center cooling system further includes a second supply line to receive at least a portion of the cooling fluid from the external cooling unit and to distribute the cooling fluid downwardly to each of cooling unit or cooling device in the second IT room to exchange heat generated by associated IT components attached thereon, where the cooling fluid evaporates into a vapor state from a liquid state during the heat exchange. The data center cooling system further includes a second return line to return the cooling fluid of the second IT room in the vapor state upwardly back to the external cooling unit, which transforms back to the liquid state due to heat exchange within the external cooling unit. For example, when the phase change fluid is delivered from the external unit to a rack, it can be: 1. directly delivered to the cold plate of the server blades; 2. delivered to a rack level cooling unit, such as a rear door heat exchanger attached to the back of the rack; and/or 3. delivered to a rack mount heat exchanger, then the two phase fluid is used to cool the rack internal fluid through the heat exchange, the rack internal fluid can be a single phase water cooling circle.

According to one embodiment, the external cooling unit includes a first fluid tank coupled to the external cooling unit to receive cooling fluid and to store sufficient amount of cooling fluid to provide sufficient liquid pressure to distribute the cooling fluid downwardly to the cold plates. A second fluid tank is coupled to the first fluid tank, wherein the second fluid tank provides additional cooling fluid to the first fluid tank when the cooling fluid in the first fluid tank falls below a predetermined threshold. A first room cooling unit is disposed within the first IT room to perform a liquid-to-air heat exchange operation to cool circulated air of the first IT room. A third supply line is coupled between the external cooling unit and the first room cooling unit to supply first cooling fluid to the first room cooling unit. A third return line is coupled between the external cooling unit and the first room cooling unit to return the first cooling fluid in a vapor state to the external cooling unit.

According to one embodiment, a second room cooling unit is disposed within the second IT room to perform a liquid-to-air heat exchange operation to cool circulated air of the second IT room. A fourth supply line is coupled between the external cooling unit and the second room cooling unit to supply second cooling fluid to the second room cooling unit. A fourth return line is coupled between the external cooling unit and the second room cooling unit to return the second cooling fluid in a vapor state to the external cooling unit. Although this disclosure describes a liquid cooling system having four supply lines and four return lines, this disclosure contemplates any suitable number of supply lines and return lines. Generally, the number of supply lines and return lines is dependent on the cooling load (i.e., the amount and density of heat produced by the IT components), the external cooling unit capacity, system design, building and infrastructure design, and so forth.

Figure 1:
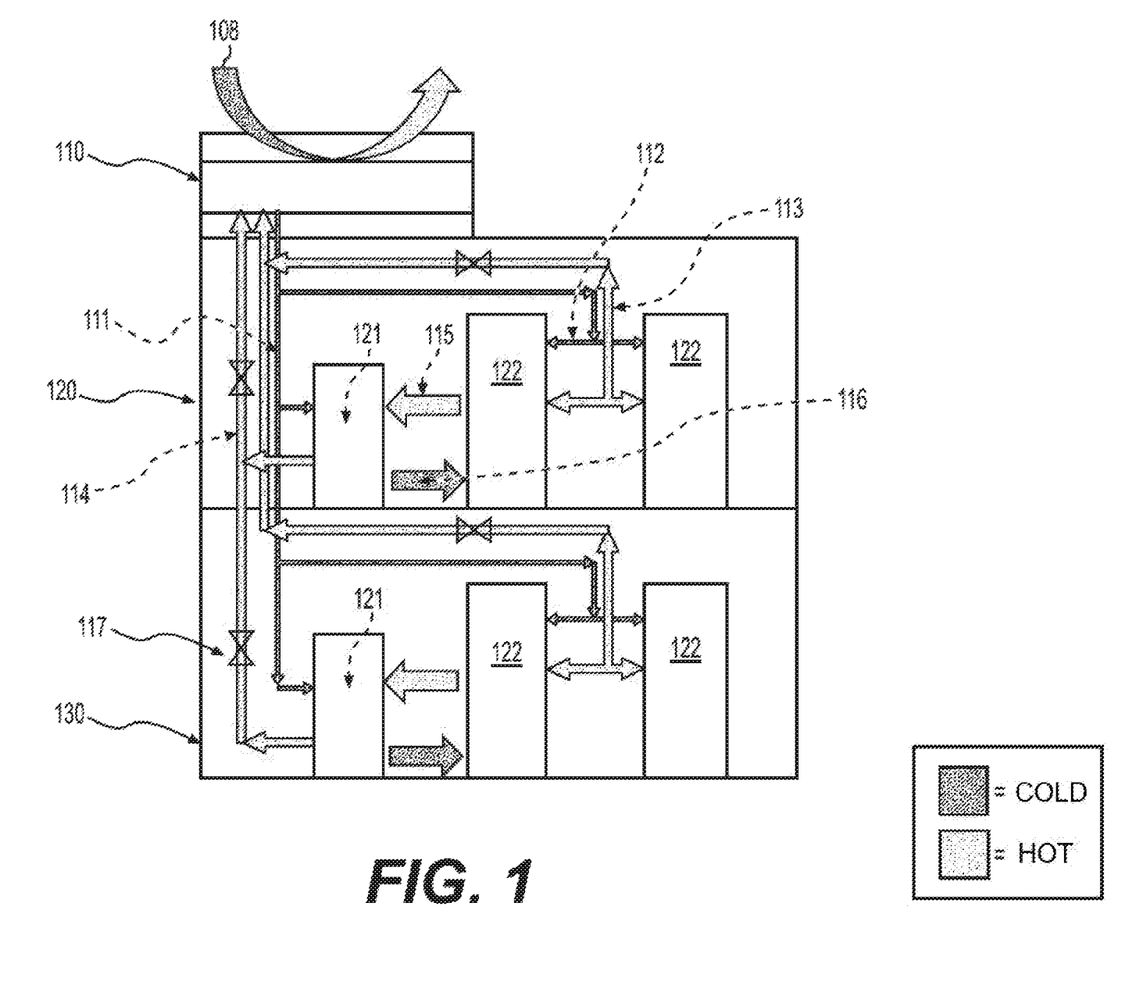
FIG. 1 is a block diagram illustrating an example of a cooling system design for data centers according to one embodiment.

FIG. 1 is a block diagram illustrating an example of a cooling system design for data centers according to one embodiment. In this example, FIG. 1 shows a side view of at least a portion of a data center having a first IT room 120, a second IT room 130, and an external cooling unit 110 on the roof. According to one embodiment, the data center system includes information technology (IT) racks 122. Electronic racks 122 house IT components, equipment or instruments, such as, for example, computer servers or computing nodes that provide data services to a variety of clients over a network (e.g., the Internet). Electronic racks 122 may be arranged in rows or in any other suitable configuration, for example, to form a cold aisle and a hot aisle between two adjacent rows for air/liquid cooling arrangements. Although two IT rooms are illustrated in FIG. 1, this disclosure contemplates any number of IT rooms being serviced by an external cooling unit located above at least one of the IT rooms, including a single IT room.

In one embodiment, each of the electronic racks 122 includes a housing to house a number of IT components operating therein. The electronic racks 122 can include a heat removal liquid manifold, a number of server slots, and a number of server blades capable of being inserted into and removed from the server slots. Each server blade represents a computing node having one or more processors, a memory, and/or a persistent storage device (e.g., hard disk). In one scenario, at least one of the processors is attached to a cold plate (also referred to as a cold plate assembly) to receive cooling liquid. In addition, one or more optional cooling fans in room cooling unit 121 are associated with the server blades to provide air cooling to the computing nodes contained therein. Note that the external cooling unit 110 may be coupled to multiple IT rooms such as IT room 120 and IT room 130. The cooling system illustrated in FIG. 1 removes a substantial amount of the heat generated within the data centers to the atmosphere. This is accomplished by two elements: the external cooling unit 110 which provides cooling fluid through supply lines 111, 112 to the cooling device (such as cold plates) of electronic racks 122, and room cooling unit 121, which also receives cooling fluid from external cooling unit 110 and emits cool air into IT room 120, 130.

The external cooling unit 110 can include, but is not limited to evaporative cooling, free air, and rejection to large thermal mass and waste heat recovery designs. In this disclosure, external cooling unit 110 may also be referred to as an external cooling system. External cooling unit 110 may optionally include a cooling liquid source such as refrigeration cycle with an evaporator and condenser that assist in cooling the vapor and liquid in the cooling system.

In one embodiment, each server blade is optionally coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet connector is to emit warmer or hotter liquid carrying the heat exchanged from the processors to the heat removal liquid manifold via a second liquid outlet connector and then back to a coolant distribution unit (CDU) within the electronic rack.

In one embodiment, fluid supply lines 111, 112 are optionally coupled to external cooling unit 110 to provide cooling fluid to room cooling units 121 and to electronic racks 122. Supply line 111 may supply cooling fluid to room cooling unit 121 and supply line 112 may provide cooling fluid to electronic racks 122. Supply lines 111-112 may be directly coupled to external cooling unit 110 or alternatively, one supply line may be branched from the other supply line that is directly coupled to external cooling unit 110. Return lines 113, 114 may return the hot vapor or hot fluid (e.g., fluid in a vapor state or vapor form) back to external cooling unit 110. Similarly, return lines 113-114 may be directly coupled to external cooling unit 110 or alternatively, one return line may merged with the other return line before reaching external cooling unit 110.

In some embodiments, the cooling fluid turns completely into vapor when heated. In other embodiments, only part of the cooling fluid turns to vapor when heated and the cooling fluid becomes a fluid-vapor mixture. In scenario, the hot vapor or fluid-vapor mixture rises due to convection. For brevity, this disclosure primarily refers to hot vapor, but contemplates hot vapor, hot fluid, and hot fluid-vapor mixture. Return line 113 may return the hot vapor from electronic racks 122 to external cooling unit 110. Return line 114 may return the hot vapor from the room cooling units 121 to external cooling unit 110. In some embodiments, fluid or vapor may be optionally stopped or partially blocked using valves 117. Valves 117 may be activated if, for example, a leak occurs in any of the supply or return lines and the lines need to be serviced. As another example, more cooling fluid may be directed to various areas in IT rooms 120, 130 by activating particular valves 117. By adjusting the valves assembled on the returning lines can achieve fluid flow and pressure balancing between rooms 120,130.

In some embodiments, the cooling system design may use thermosiphon technology to circulate the cooling fluid and transfers heat without using a mechanical pump. The cooling fluid is delivered from external cooling unit 110 to IT rooms 120 and 130 using gravity. When the fluid is heated by the heat-generating electronic components, it turns into vapor. In some embodiments, the fluid becomes a fluid-vapor mix—partially fluid and partially vapor. In either case, the heated fluid or vapor experiences a decrease in density. It becomes lighter and expands and rises up through the return lines 113, 114 back to external cooling unit 110. This operates on the principle of natural convection with is caused by variation in fluid density between the cold fluid and the hot fluid/vapor. Supply lines 111, 112 are able to then be replenished with more cooling fluid and a circulation is formed. In a closed loop, gravity acts on the fluid to recirculate the fluid in the cooling system. On the heating side, the fluid turns into vapor by absorbing heat. In external cooling unit 110, the vapor is cooled and turns back into liquid and the heat is extracted by external cooling unit 110 and is expelled into outside environment 108.

In one embodiment, the heat removal liquid manifold disposed on the backend of each electronic rack is coupled to liquid supply lines 111, 112 to receive cooling fluid from external cooling unit 110. The cooling fluid is distributed through a liquid distribution loop attached to a cold plate assembly on which a processor is mounted to remove heat from the processors. A cold plate is configured similar to a heat sink with a liquid distribution tube or channel attached or embedded therein. The resulting warmer or hotter vapor or fluid carrying the heat exchanged from the processors is transmitted via liquid return lines 113, 114 back to external cooling unit 110. Liquid supply/return lines 111-114 are referred to as data center or room liquid supply/return lines (e.g., global liquid supply/return lines), which supply heat removal liquid to all of the electronic racks 122. The fluid that is delivered to electronic racks 122 via supply lines 111, 112 may be understood as using server/IR liquid cooling or rack-level heat exchange. When the cooling fluid captures the heat and changes its phase into vapor, it returns back to external cooling unit 110. It may be the case that no mechanical pump is used in the fully system, and the larger the heat load, the faster the system recirculates. In addition valves 117 may be used on the return line for adjusting system resistance for controlling the speed of the recirculating fluid.

In one embodiment, the cooling system design illustrated in FIG. 1 may further include optional room cooling units 121 (e.g., liquid-to-air heat exchangers) to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, room cooling units 121 generates airflow of cool/cold air 116 to circulate from the aisles between electronic racks 122 to carry away exchanged heat. The cool airflows enter the electronic racks through their frontends and the warm/hot airflows exit the electronic racks from their backends. The warm/hot air 115 with exchanged heat is exhausted from room/building. Thus, in one embodiment, the cooling system may be considered as a hybrid liquid-air cooling system, where a portion of the heat generated by a processor is removed by cooling liquid via the corresponding cold plate, while the remaining portion of the heat generated by the processor (or other electronics or processing devices) is removed by airflow cooling. Some of the IT components may not be suitable for liquid cooling (e.g., local rack power supply). In such a scenario, air cooling can be utilized via room cooling units 121. Room cooling units 121 can be connected to the external cooling unit 110 to extract the heat to the atmosphere. Room cooling units 121 may be any type of cooling unit which is used for cooling data center room recirculated air, such as CRAC/CRAH, In-ROW, OCU, and so on. Room cooling unit 121 may be understood to be a liquid-to-air heat exchanger.

Figure 2:
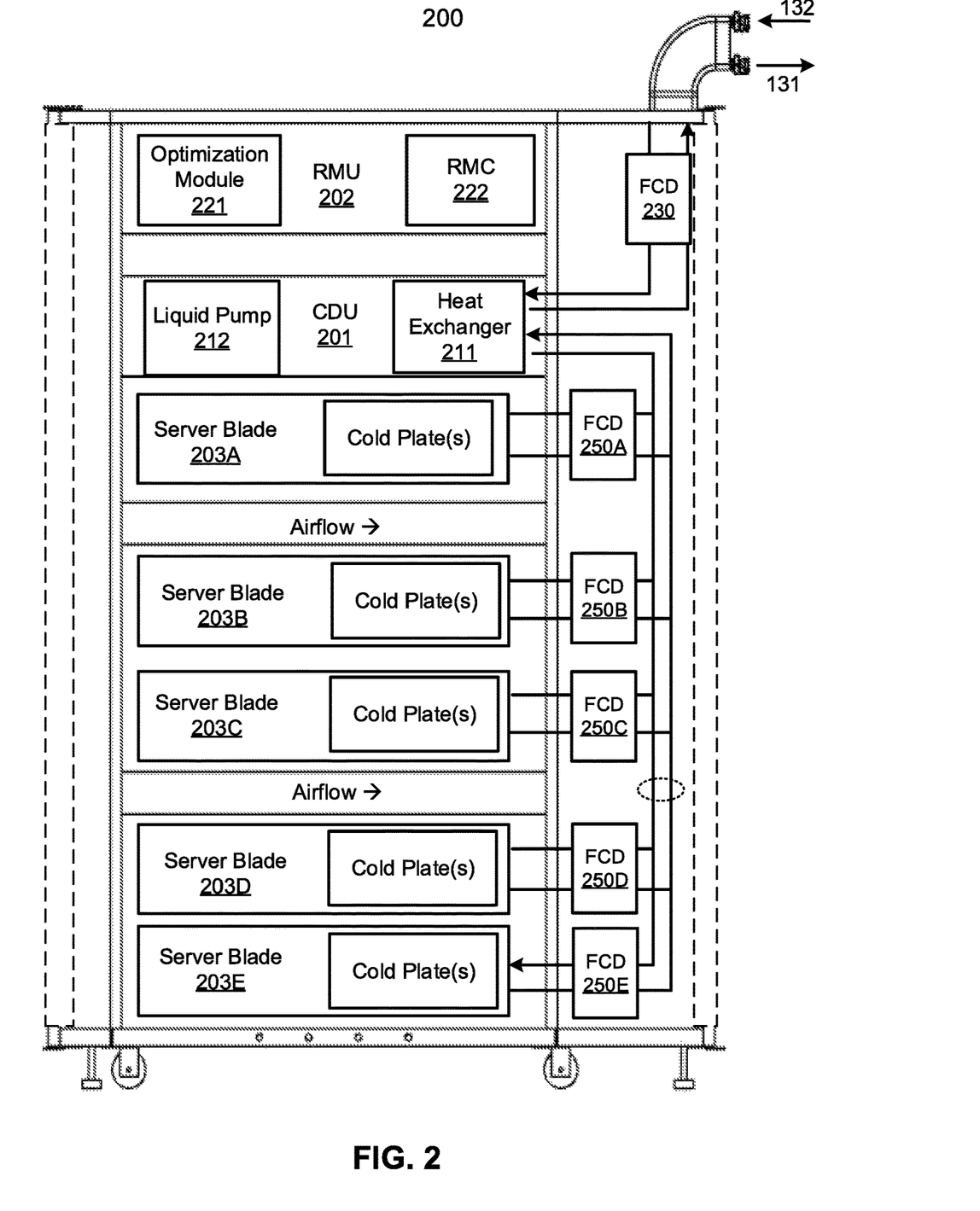
FIG. 2 is a block diagram illustrating an example of an electronic rack according to one embodiment.

FIG. 2 is block diagram illustrating an electronic rack according to one embodiment. Electronic rack 200 may represent the electronic racks 122. Referring to FIG. 2, according to one embodiment, electronic rack 200 includes, but is not limited to, optional CDU 201, RMU 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container, as long as the cooling fans can generate airflows from the frontend to the backend.

In addition, for at least some of the server blades 203, an optional fan module (not shown) is associated with the server blade. Each of the fan modules includes one or more cooling fans. The fan modules may be mounted on the backends of server blades 203 or on the electronic rack to generate airflows flowing from frontend 204, traveling through the air space of the sever blades 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors 230 coupled to external liquid supply/return lines 131-132 to form a primary loop. The connectors 230 coupled to the external liquid supply/return lines 131-132 may be disposed or mounted on backend 205 of electronic rack 200. Liquid supply/return lines 131 and 132 are connected to 113 and 112 in FIG. 1, respectively. The liquid supply/return lines 131-132, also referred to as room liquid supply/return lines, are coupled to external cooling unit 110 as described above. In addition, heat exchanger 211 further includes a second loop with two ports having a second pair of liquid connectors coupled to liquid manifold 250A-250E to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 200 may optionally further include RMU 202 configured to provide and manage power supplied to servers 203 and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery unit, transformer, or regulator, etc.,) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and air temperatures, which may be captured and collected via various temperature sensors. The monitor may also receive data representing the fan power and pump power generated by the fan modules and liquid pump 212, which may be proportional to their respective speeds. These operating data are referred to as real-time operating data. Further, the monitor may further receive signals indicating whether liquid leak occurs in any of the server blades, for example from leak detectors and/or sensors (e.g., liquid sensors, temperature sensors). Note that the monitor may be implemented as a separate module within RMU 202.

Based on the operating data, optimization module 221 performs an optimization using a predetermined optimization function or optimization model to derive a set of optimal fan speeds for fan modules and an optimal pump speed for liquid pump 212, such that the total power consumption of liquid pump 212 and the fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server blades 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

As described above, each of the server blades includes a number of IT components such as processors or processing units that may generate heat during the operations. According to one embodiment, the IT components of each server blade are attached to an integrated cooling module having an array of cold plates arranged therein to be attached to an external surface of each of the IT components for heat exchange.

Figure 3:
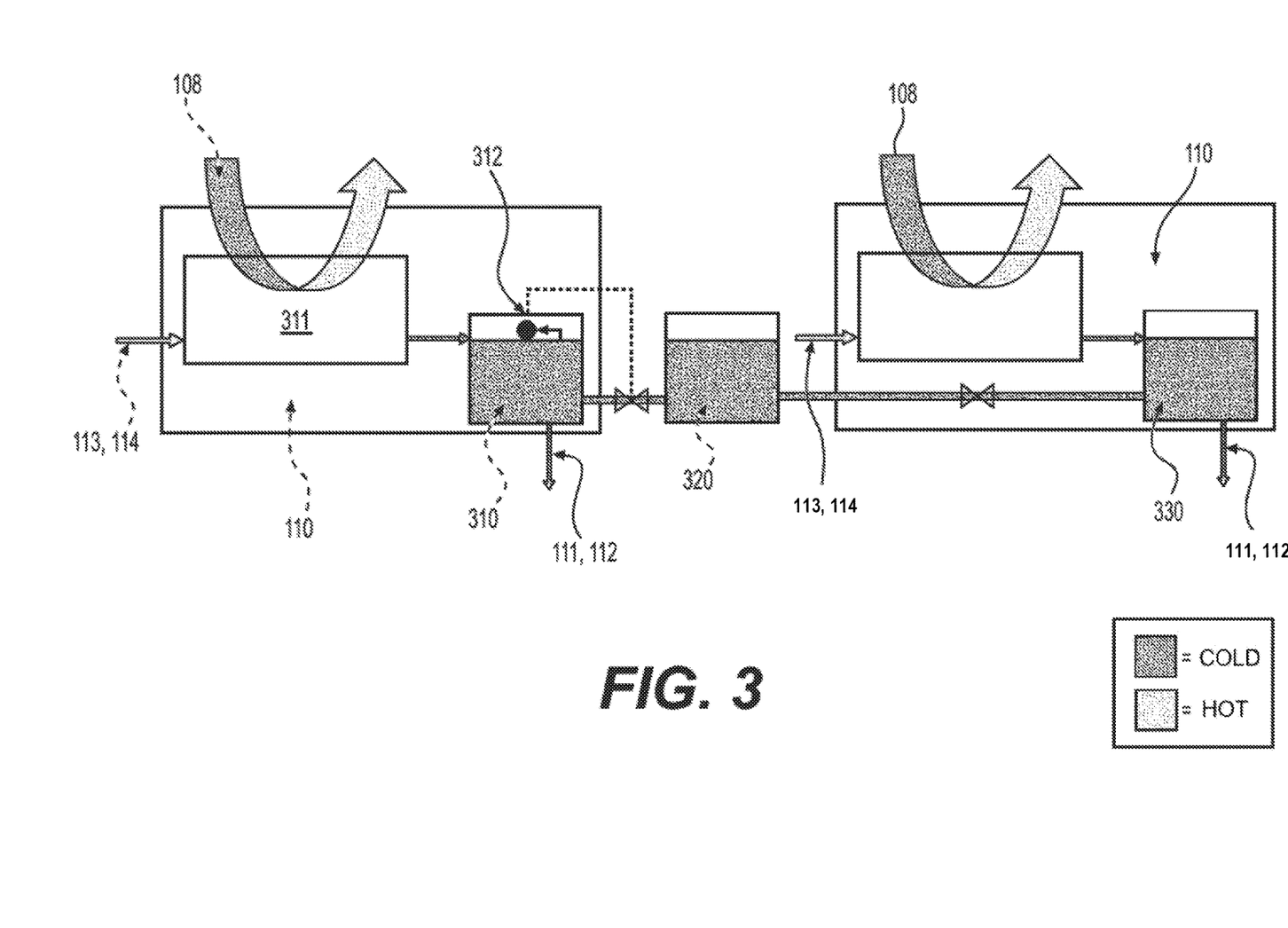
FIG. 3 is a block diagram illustrating example external cooling units according to one embodiment.

FIG. 3 is a block diagram illustrating an example external cooling unit according to one embodiment. External cooling unit 110 may include a heat exchanger 311 and a cooling fluid tank 310. When hot vapor returns via return lines 113, 114 and enters the external cooling unit 110, it may then enter heat exchanger 311. Heat exchanger 311 may include a condenser that condenses the hot vapor via cooling and changes the phase of the vapor back to a liquid. Thus, the hot vapor may enter heat exchanger 311 as a vapor, may be cooled via a heat exchange, and then may exit heat exchanger 311 as a liquid. Once it has been changed to a liquid, the fluid may enter fluid tank 310. Fluid tank 310 may function to ensure that the cooling system is supplied with sufficient fluid. External fluid tank 320 may be coupled to fluid tank 310 to ensure that fluid tank 310 has sufficient fluid. Fluid sensor 312 may be placed in or on fluid tank 312 and may communicate to fluid tank 320 when the fluid in fluid tank 310 drops below a threshold. The fluid level may be sensed by a liquid level sensor (e.g., a floating ball mechanism), which in turn turns on a valve disposed on a connection between tank 310 and tank 320. External fluid tank 320 may be coupled to more than one fluid tank. As an example, external fluid tank 320 may be coupled to fluid tank 330 as well as fluid tank 310. Fluid tank 330 may have its own fluid level sensor (not illustrated) that may communicate to fluid tank 320 when the fluid in fluid tank 330 drops below a threshold. In response, a liquid valve or switch between tank 320 and tank 330 is turned on in which external fluid tank 320 may supply fluid tank 330 with additional fluid. Fluid tank 320 may be necessary to sustain liquid pressure throughout the cooling system. Without fluid tank 320, fluid tank 310 could in theory receive fluid from fluid tank 330, or vice versa, but connecting these two fluid tanks with an open fluid connection may the fluid recirculation. Therefore, fluid tank 320 may be used to refill the whole system and for system fluid maintenance and service. FIG. 3 includes one external fluid tank 320 servicing two internal fluid tanks 310, 330, but this disclosure contemplates an external fluid tank servicing any number of external fluid tanks.

Figure 4:
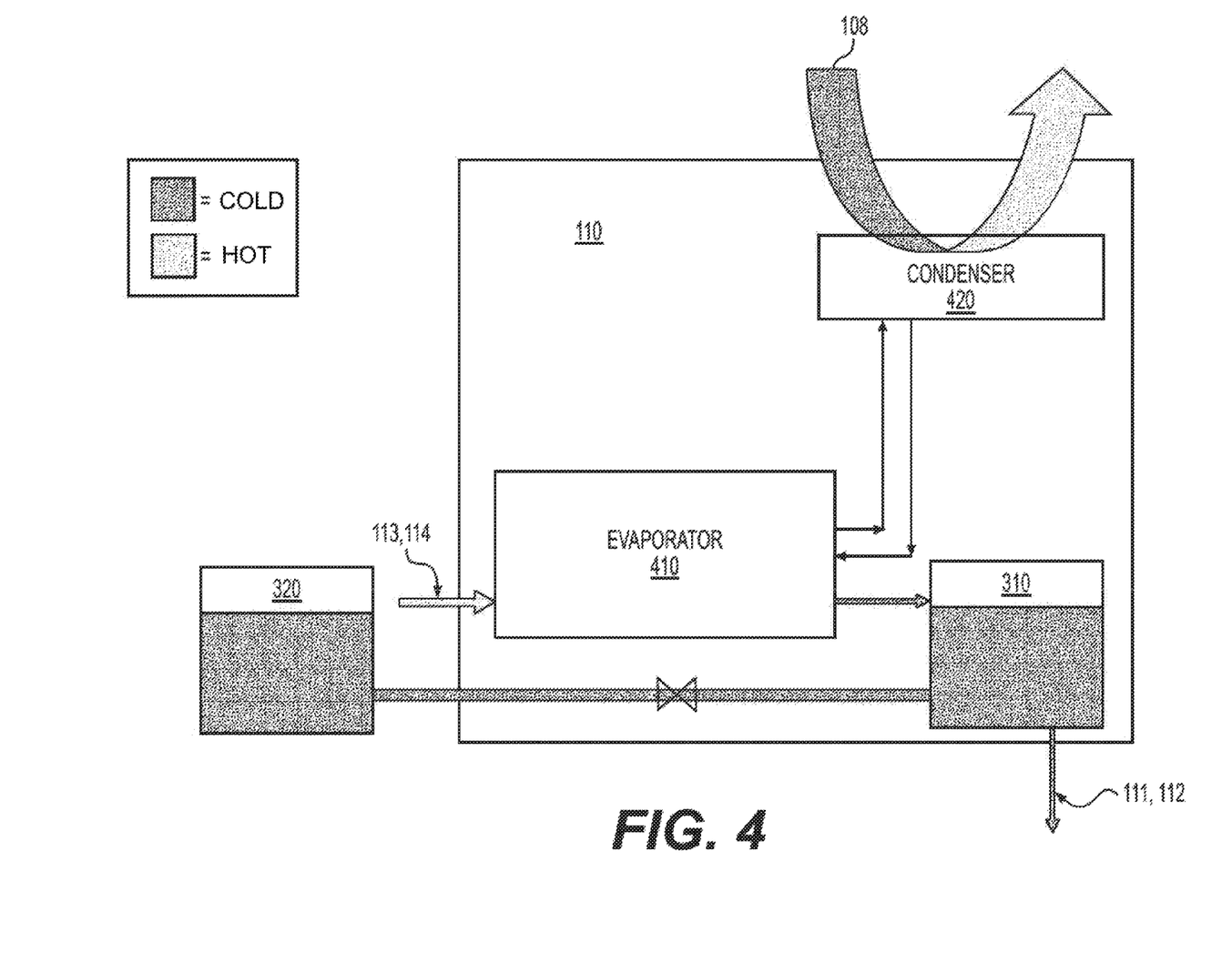
FIG. 4 is a block diagram illustrating an example external cooling unit according to one embodiment.

FIG. 4 is a block diagram illustrating an example external cooling unit according to one embodiment. In this example, external cooling unit 110 may optionally include an evaporator 410 and a condenser 420. Evaporator 410 and condenser 420 may enable the operation of a direct expansion (DX) refrigeration cooling cycle. The DX cooling loop may cool the hot vapor that enters the evaporator 410. A DX cooling loop inside external cooling unit 110 may be beneficial when the external cooling unit is located in a hot area or where the ambient conditions are not conducive to cooling the hot vapor. In such a situation, evaporator 410 and condenser 420 may be used to cool the hot vapor and change its phase back to liquid so it can then be recirculated throughout the cooling system through supply lines 111, 112.

Figure 5:
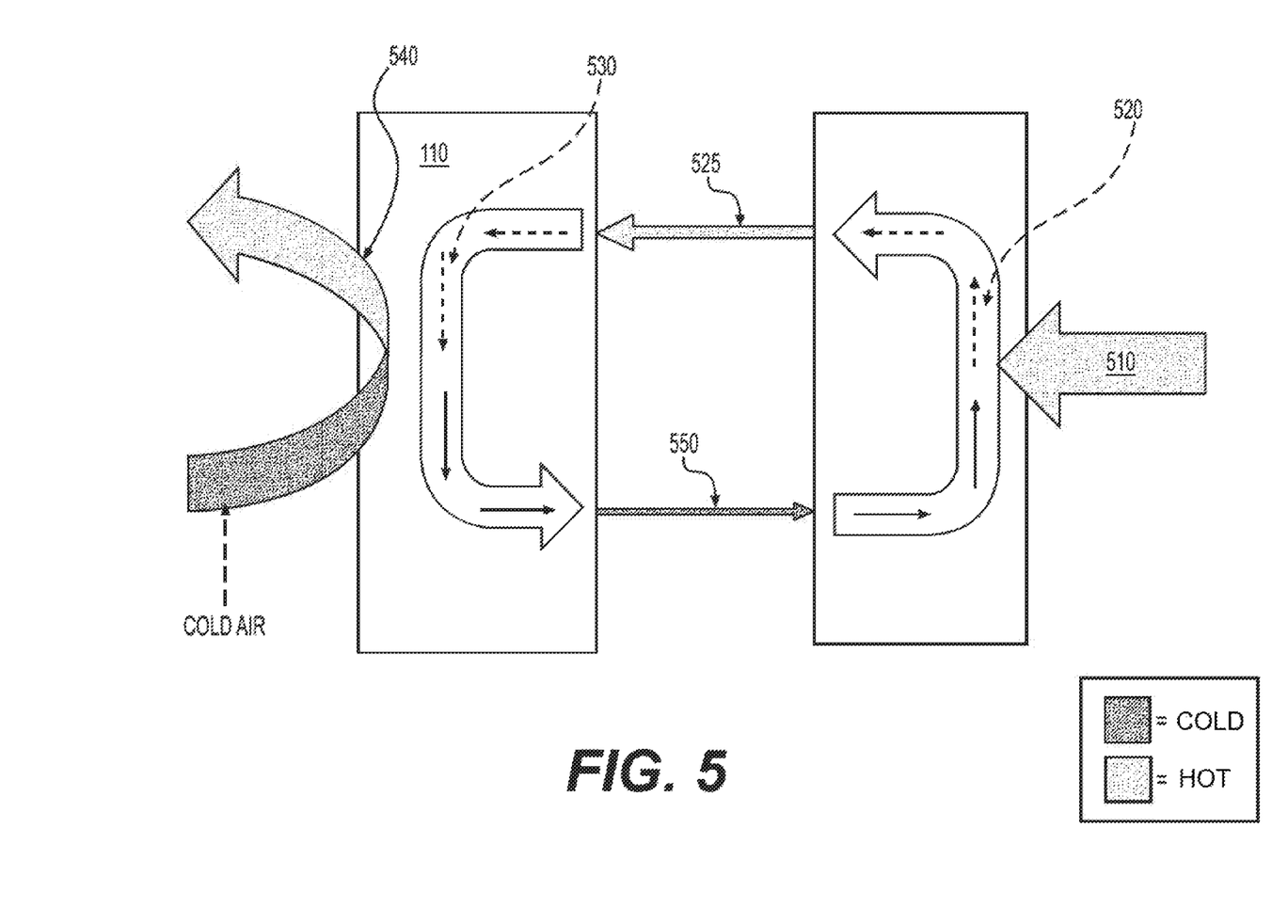
FIG. 5 is a block diagram illustrating an example cooling system using thermosiphon technology.

FIG. 5 is a block diagram illustrating an example cooling system using thermosiphon technology. Electronic components (not illustrated) may heat the surrounding air and thus generate hot air 510 in the IT room. Hot air 510 may heat the cooling fluid in line 520. The cooling fluid may become hot and turn to vapor. The vapor 525 may rise through line 520 and pass through to the external cooling unit 110 where it undergoes a heat exchange 540. Cold air from either a DX cooling loop or the outside environment may optionally be brought in to cool the hot vapor. Heat may be removed from hot vapor 510 and may be expelled into the environment. The hot vapor may change phase to a liquid, may be further cooled and may be used as cooling fluid 550. It then may travel through supply line 530 and used to cool the electronic racks either by cooling the data center air (via room cooling unit 121) or by coming into contact with cold plates that are attached to heat-generating electronics.

Figure 6:
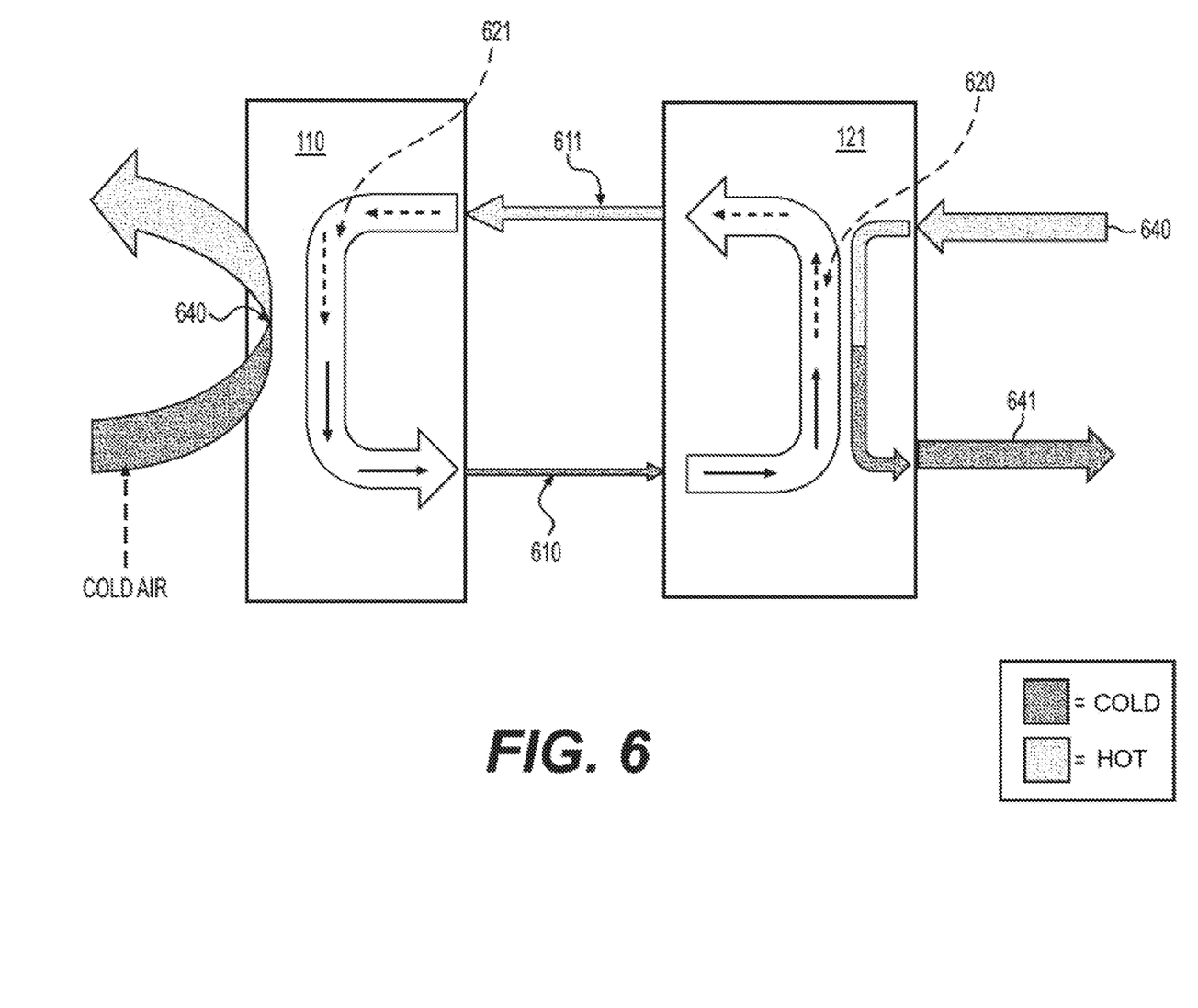
FIG. 6 is a block diagram illustrating thermosiphon technology and a heat exchanger.

FIG. 6 is a block diagram illustrating thermosiphon technology and room cooling unit 121. Electronic components (not illustrated) heat the cooling fluid and thus generate hot fluid 640 in the IT room (FIG. 6 represents using room cooling unit 121 to cool fluid, FIG. 5 represents using room cooling unit 121 to cool air). Hot fluid 640 enters room cooling unit 121. Hot fluid 640 comes into contact with cooling fluid 610 and then becomes cooled. As it cools it sinks and is expelled as cool fluid 641 back into the IT room to cool the electronic racks (not illustrated). The cooling fluid 610 absorbs the heat from hot fluid 640. As it absorbs the heat it at least partially turns to vapor 611, achieves a lower density, and rises through line 620. The hot vapor 611 passes through to the external cooling unit 110 via return line 621 where it undergoes a heat exchange 640. Cold air from either a DX (direct exchange) cooling loop or the outside environment is brought in to cool the hot vapor. Heat is removed from hot vapor 611 and is expelled into the environment. The hot vapor changes phase to a liquid, is further cooled and becomes cooling fluid 610. It then travels through supply line 620 and is used to cool the electronic racks via room cooling unit 121. At this point the fluid has been recirculated and the above process may begin again.

Figure 7:
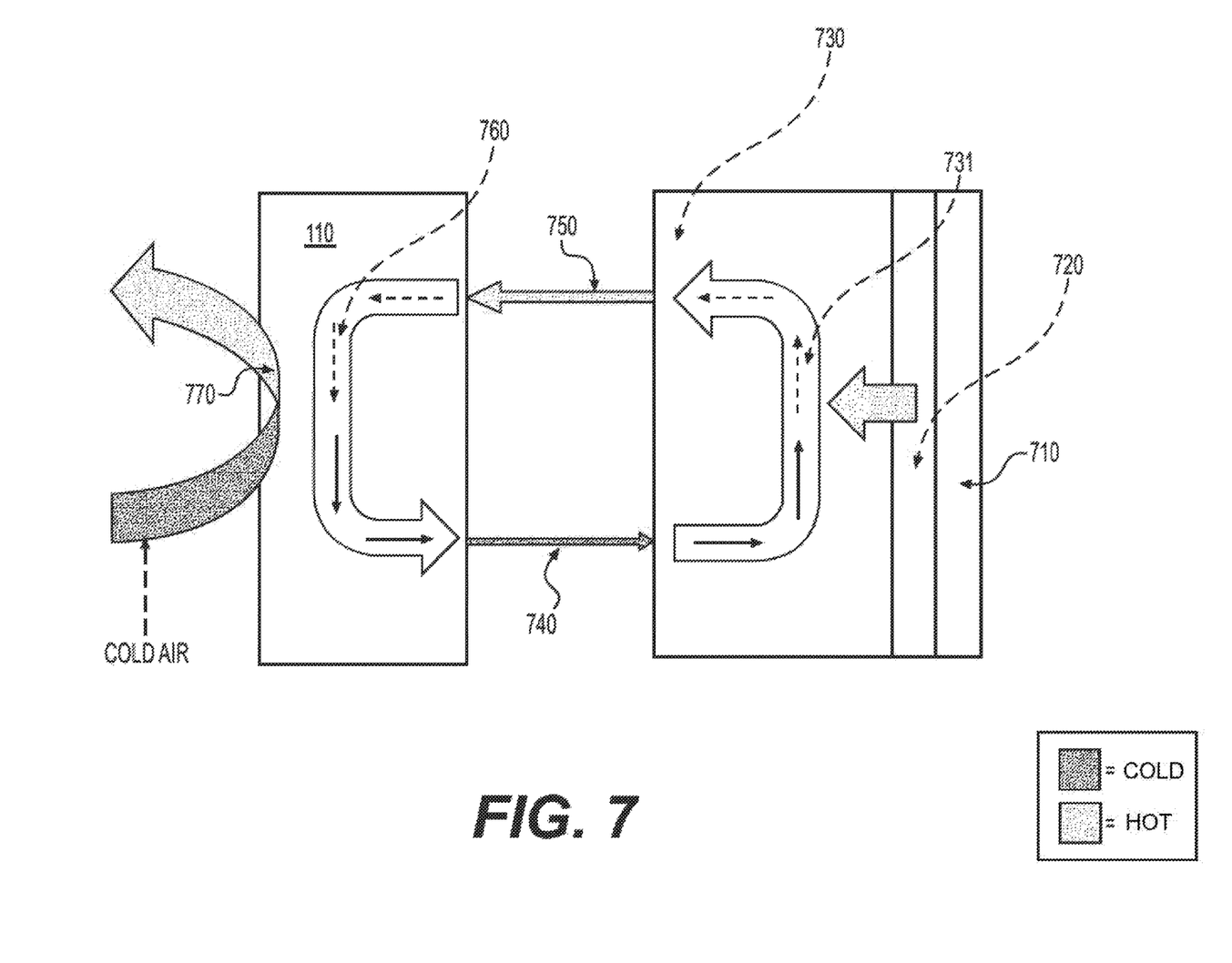
FIG. 7 is a block diagram illustrating thermosiphon technology to cool heat generating components directly.

FIG. 7 is a block diagram illustrating thermosiphon technology to cool heat-generating components directly. Electronic components 710 are in contact with cold plate 720. Cold plate 720 acts as a heat sink by absorbing the heat generated by electronic components 710. Cold plate 720 is also in contact with IT cooling device 730 which includes supply line 731 that is filled with cooling fluid 740. Cold plate 720 is cooled by cooling fluid 740 which in turn cools electronic components 710. The cooling fluid 740 absorbs the heat from cold plate 720. As it absorbs the heat it at least partially turns to vapor 750, achieves a lower density, and rises through line 731. The hot vapor 750 passes through to the external cooling unit 110 via return line 760 where it undergoes a heat exchange 770. Cold air from either a DX cooling loop or the outside environment is brought in to cool the hot vapor. Heat is removed from hot vapor 750 and is expelled into the environment. The hot vapor changes phase to a liquid, is further cooled and becomes cooling fluid 740. It then travels through supply line 731 and is used to cool the electronic racks via IT cooling device 730. At this point the fluid has been recirculated and the above process may begin again. In certain designs, IT cooling device 730 and cold plate 720 can be understood as one single unit, a cold plate or evaporator where heat is absorbed and liquid changes phase into vapor.

Figure 8:
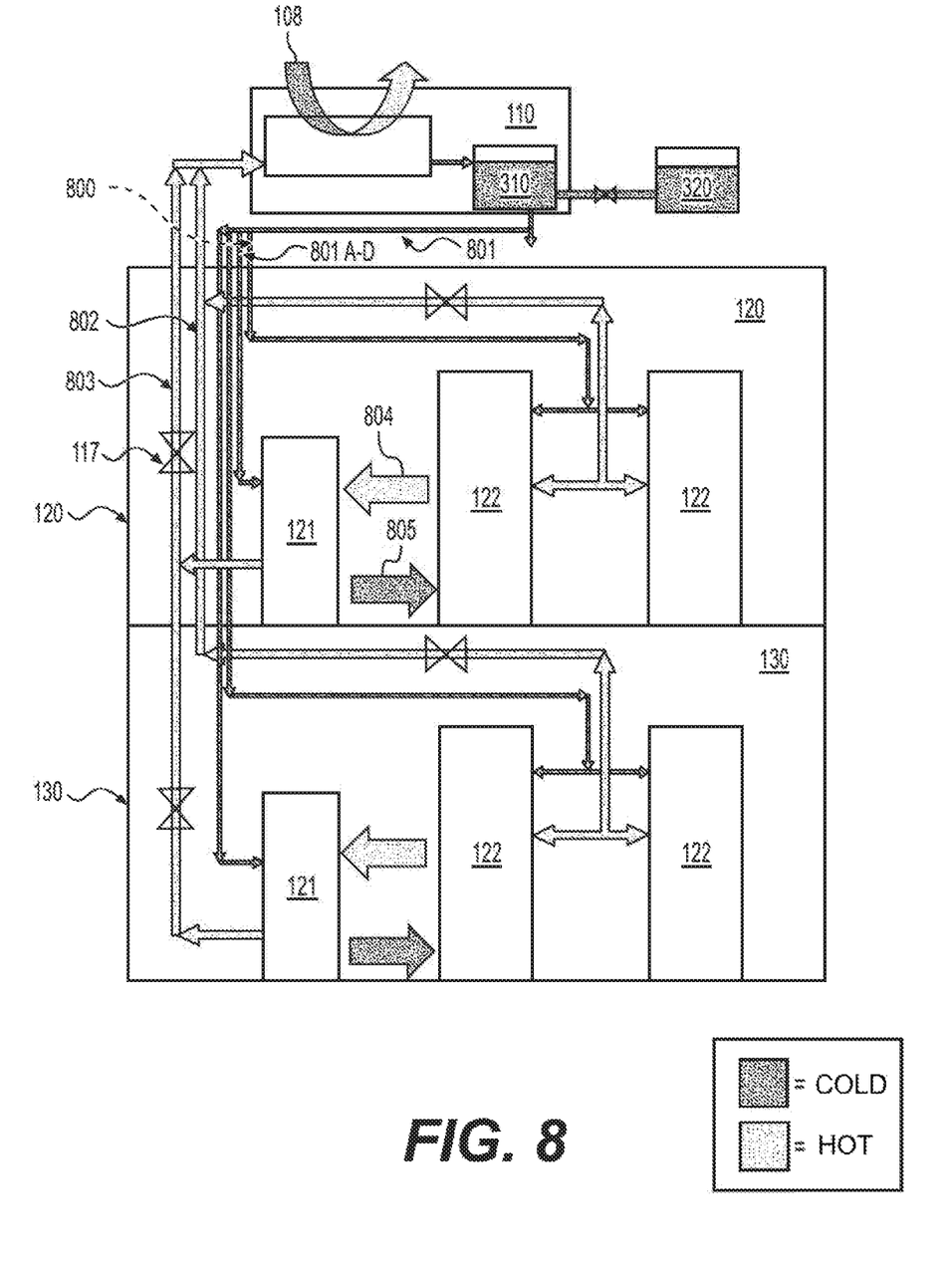
FIG. 8 is a block diagram illustrating an example of a cooling system design for data centers according to one embodiment.

FIG. 8 is a block diagram illustrating an example of a cooling system design for data centers according to another embodiment. The cooling system illustrated in FIG. 8 may include external cooling unit 110 which itself may include fluid tank 310. External fluid tank 320 may also be used to ensure sufficient fluid in the system as discussed above. This design uses a set of thermosiphon loops 800 in which each thermosiphon loop is distinct from the others. Cooling fluid may exit external cooling unit 110 via supply line 801 and may then proceed to any of supply lines 801a-d. If entering supply line 801a, the cooling fluid may proceed down to IT room 130 and enter room cooling unit 121. From there room cooling unit 121 generates airflow of cool/cold air 805 to circulate from the aisles between electronic racks 122. Cooling unit 121 then cools the returning hot air 804 by absorbing the heat. The cooling fluid may then turn to vapor and rise back up to external cooling unit via return line 803. If entering supply line 801b, the cooling fluid may proceed down to IT room 130 and enter electronic racks 122. The cooling fluid may cool the IT components within electronic racks 122 using the methods described with regard to FIG. 7. As the cooling fluid absorbs the heat generated by the electronic components, the cooling fluid may then turn to vapor and rise back up to external cooling unit via return line 802.

If entering supply line 801c, the cooling fluid may proceed down to IT room 120 and enter room cooling unit 121. From there it may cool the hot air received by room cooling unit 121 by absorbing the heat. The cooling fluid may then turn to vapor and rise back up to external cooling unit via return line 803. If entering supply line 801d, the cooling fluid may proceed down to IT room 120 and enter electronic racks 122. The cooling fluid may cool the IT components within electronic racks 122 using the methods described with regard to FIG. 7. As the cooling fluid absorbs the heat generated by the electronic components, the cooling fluid may then turn to vapor and rise back up to external cooling unit via return line 802. The system supply line and return line design can be varied based on actual use cases.

In some embodiments, the external cooling units may be separated for different thermosiphon loops. As an example, a first external cooling unit may be responsible for the thermosiphon loops that include supply lines 801a and 801b, and a second external cooling unit may be responsible for the thermosiphon loops that include supply lines 801c and 801d. This may enable the cooling system to have more control over the fluid recirculation. During circulation of the cooling fluid and hot vapor, the heat generated by the IT components within the data center may either directly or indirectly drive the fluid circulation using the principles of convection and gravity, as discussed herein. The heat may be either directly extracted into the fluid or indirectly extracted into the fluid through data center air. In addition, because the external unit is mounted above the IT room(s), gravity may be sufficient for assisting the recirculation of the fluid.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center cooling system, comprising:
   a first information technology (IT) room having a first set of a plurality of electronic racks, each of the electronic racks in the first set containing a plurality of IT components therein, wherein at least a portion of the IT components are attached to cold plates;
   an external cooling unit positioned above the first IT room, the external cooling unit including a heat exchanger, configured to provide cooling fluid and to exchange heat carried by the cooling fluid;
   a supply line to receive the cooling fluid from the external cooling unit and to distribute the cooling fluid downwardly to each of the cold plates in the first IT room to exchange heat generated by associated IT components attached thereon, wherein the cooling fluid evaporates into a vapor state from a liquid state during the heat exchange; and
   a return line to return the cooling fluid in the vapor state upwardly back to the external cooling unit, which transforms back to the liquid state due to heat exchange within the external cooling unit;
   wherein the external cooling unit includes a first fluid tank external to the heat exchanger and fluidly coupled to the heat exchanger to receive cooling fluid and to store sufficient cooling fluid to provide sufficient liquid pressure to distribute the cooling fluid downwardly through the supply line.

2. The data center cooling system of claim 1, further comprising:
   a second IT room positioned underneath the first IT room, the second IT room having a second set of a plurality of electronic racks, each of the electronic racks in the second set containing a plurality of IT components therein, wherein at least a portion of the IT components in the second set are attached to cold plates,
   wherein the supply line is further to distribute the cooling fluid downwardly to each of the cold plates in the second IT room to exchange heat generated by associated IT components attached thereon, wherein the cooling fluid evaporate into a vapor state from a liquid state during the heat exchange to be returned back to the external cooling unit via the return line.

3. The data center cooling system of claim 2, wherein the return line comprises a first section disposed within the first IT room and a second section disposed within the second IT room, wherein the first section includes a first valve to adjust a resistance of vapor travelling upwardly within the first section, and the second section includes a second valve to adjust a resistance of vapor travelling upwardly within the second section.

4. The data center cooling system of claim 1, further comprising a second fluid tank coupled to the first fluid tank, wherein the second fluid tank provides additional cooling fluid to the first fluid tank when the cooling fluid in the first fluid tank falls below a predetermined threshold.

5. The data center cooling system of claim 4, wherein the first fluid tank comprises a fluid level sensor to sense a fluid level within the first fluid tank, which causes a valve between the first fluid tank and the second fluid tank opened, in response to detecting that the cooling fluid in the first fluid tank falls below the predetermined threshold.

6. The data center cooling system of claim 4, wherein the second fluid tank is further coupled to a third fluid tank of a second external cooling unit that is configured to provide cooling fluid to a third IT room.

7. The data center cooling system of claim 1, wherein the external cooling unit, the supply line, and the return line are part of a thermosiphon loop without having to use a pump to circulate the cooling fluid.

8. The data center cooling system of claim 1, wherein the external cooling unit provides cooling fluid downwardly to the cold plates using gravity as only force to move the cooling fluid without having to use a pump.

9. The data center cooling system of claim 1, wherein the cooling fluid in the vapor state is returned upwardly to the external cooling unit due to lower density and lighter in weight of the cooling fluid in the vapor state without having to use a pump.

10. The data center cooling system of claim 1, further comprising a room cooling unit disposed within the first IT room, wherein the room cooling unit comprises a liquid-to-air heat exchanger coupled to the supply line to receive cooling fluid, to exchange heat from circulated air of the first IT room, and to return back to the external cooling unit in the vapor state via the return line.

11. The data center cooling system of claim 10, wherein the circulated air is to travel through an air space of at least a portion of the electronic racks to exchange at least a portion of the heat generated from the associated IT components.

12. The data center cooling system of claim 10, wherein the supply line comprises a first supply line to supply a first portion of the cooling fluid to the electronic racks and a second supply line to supply a second portion of the cooling fluid to the room cooling unit.

13. The data center cooling system of claim 10, wherein the return line comprises a first return line to return a first portion of the cooling fluid in the vapor state received from the electronic racks and a second return line to return a second portion of the cooling fluid received from the room cooling unit.

14. The data center cooling system of claim 1, wherein the return line comprises a valve that can be controlled to adjust a resistance of vapor travelling upwardly, which in turn adjust a flow rate of the cooling fluid flowing downwardly.

15. A data center cooling system, comprising:
a first information technology (IT) room having a first set of a plurality of electronic racks, each of the electronic racks in the first set containing a plurality of IT components therein, wherein at least a portion of the IT components are attached to cold plates;
a second IT room positioned underneath the first IT room, the second IT room having a second set of a plurality of electronic racks, each of the electronic racks in the second set containing a plurality of IT components therein, wherein at least a portion of the IT components in the second set are attached to cold plates;
an external cooling unit positioned above the first IT room, the external cooling unit including a heat exchanger, configured to provide cooling fluid and to exchange heat carried by the cooling fluid;
a first supply line to receive at least a portion of the cooling fluid from the external cooling unit and to distribute the cooling fluid downwardly to each of the cold plates in the first IT room to exchange heat generated by associated IT components attached thereon, wherein the cooling fluid evaporates into a vapor state from a liquid state during the heat exchange;
a first return line to return the cooling fluid of the first IT room in the vapor state upwardly back to the external cooling unit, which transforms back to the liquid state due to heat exchange within the external cooling unit;
a second supply line to receive at least a portion of the cooling fluid from the external cooling unit and to distribute the cooling fluid downwardly to each of the cold plates in the second IT room to exchange heat generated by associated IT components attached thereon, wherein the cooling fluid evaporates into a vapor state from a liquid state during the heat exchange; and
a second return line to return the cooling fluid of the second IT room in the vapor state upwardly back to the external cooling unit, which transforms back to the liquid state due to heat exchange within the external cooling unit;
wherein the external cooling unit includes a first fluid tank external to the heat exchanger and fluidly coupled to the heat exchanger to receive cooling fluid and to store sufficient cooling fluid to provide sufficient liquid pressure to distribute the cooling fluid downwardly through the first and second supply lines.

16. The data center cooling system of claim 15, further comprising a second fluid tank coupled to the first fluid tank, wherein the second fluid tank provides additional cooling fluid to the first fluid tank when the cooling fluid in the first fluid tank falls below a predetermined threshold.

17. The data center cooling system of claim 15, further comprising:
a first room cooling unit disposed within the first IT room to perform a liquid-to-air heat exchange operation to cool circulated air of the first IT room;
a third supply line coupled between the external cooling unit and the first room cooling unit to supply first cooling fluid to the first room cooling unit; and
a third return line coupled between the external cooling unit and the first room cooling unit to return the first cooling fluid in a vapor state to the external cooling unit.

18. The data center cooling system of claim 17, further comprising:
- a second room cooling unit disposed within the second IT room to perform a liquid-to-air heat exchange operation to cool circulated air of the second IT room;
- a fourth supply line coupled between the external cooling unit and the second room cooling unit to supply second cooling fluid to the second room cooling unit; and
- a fourth return line coupled between the external cooling unit and the second room cooling unit to return the second cooling fluid in a vapor state to the external cooling unit.

* * * * *